United States Patent [19]

Kuroda

[11] Patent Number: 5,374,579
[45] Date of Patent: Dec. 20, 1994

[54] METHOD OF FABRICATING A SEMICONDUCTOR DRAM

[75] Inventor: Hideaki Kuroda, Kanagawa, Japan

[73] Assignee: Sony Corporation, Tokyo, Japan

[21] Appl. No.: 108,518

[22] Filed: Aug. 18, 1993

[30] Foreign Application Priority Data

Aug. 18, 1992 [JP] Japan .................................. 4-242802

[51] Int. Cl.⁵ ........................................... H01L 21/70
[52] U.S. Cl. ....................................... 437/52; 437/47;
 437/60; 437/919
[58] Field of Search ....................... 437/47, 48, 52, 60,
 437/919, 233; D57/68, 71

[56] References Cited

U.S. PATENT DOCUMENTS

| | | | |
|---|---|---|---|
| 4,882,289 | 11/1989 | Moriuchi et al. | 437/52 |
| 4,971,924 | 11/1990 | Tigelaar et al. | 437/52 |
| 5,010,039 | 4/1991 | Ku et al. | 437/233 |
| 5,049,965 | 3/1992 | Ozaki et al. | 437/60 |

Primary Examiner—Tom Thomas
Attorney, Agent, or Firm—Hill, Steadman & Simpson

[57] ABSTRACT

A semiconductor DRAM comprises: a stacked capacitor (41) comprising a storage node electrode (42) a capacitor dielectric film (44) and a plate electrode (43), and formed in a memory cell area of a semiconductor substrate (11); and bit lines (18). A plate electrode forming film (53) having a portion extending over the entire memory cell area (21) or at least over an area including the plate electrode (43) and bit contact forming portions (24) in the memory cell area (21), and contact forming portions (34) in the peripheral circuit area (31) is formed, a second layer insulating film (15) is formed over the plate electrode forming film (53), bit contact holes (25) and contact holes (36) are formed respectively in the bit contact forming portions (24) and the contact forming portions (31) through the plate electrode forming film (53), the side surfaces of the bit contact holes (25) and the contact holes (36) are coated respectively with insulating films (26, 37), conductive plugs (16, 17) are formed in the bit contact holes (25) and the contact holes (36), and bit lines (18) are formed on the second layer insulating film (15) so as to be connected to the conductive plugs (16, 17).

2 Claims, 7 Drawing Sheets

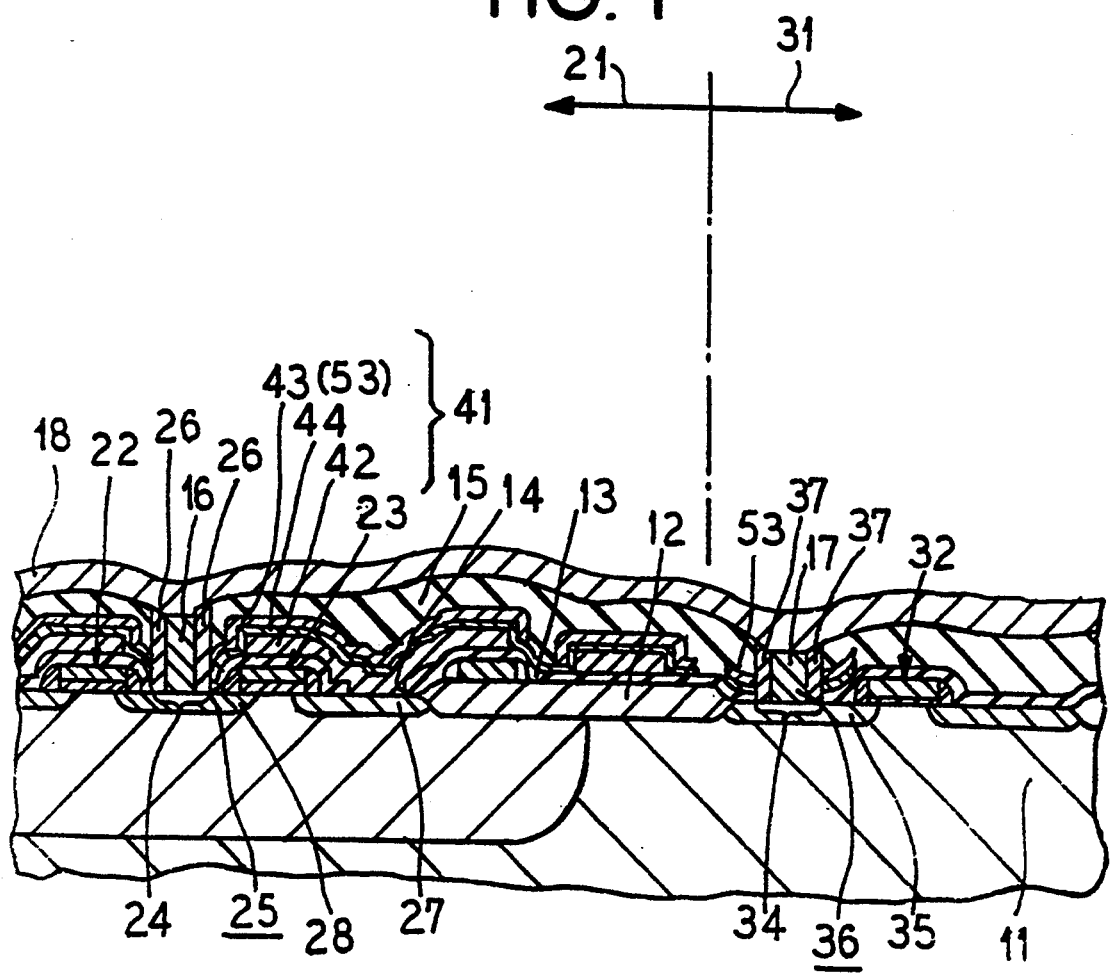

METHOD OF FABRICATING A SEMICONDUCTOR DRAM

BACKGROUND OF THE INVENTION

1. Field of the Invention

The present invention relates to a method of fabricating a semiconductor dynamic read-and-write memory (hereinafter, abbreviated to "DRAM").

2. Description of the Prior Art

Referring to FIG. 7, when fabricating each of the memory cells of a semiconductor DRAM 3, an isolating region is formed in a semiconductor substrate 11 by a known element isolating process to separate a memory cell area 21 and a peripheral circuit area 31. Transistors 22 and 23 are formed in the memory cell area 21, and then a transistor 32 is formed in the peripheral circuit area 31. Then, a first layer insulating film 13 is formed so as to cover the transistors 22, 23 and 32. A contact hole 14 is formed through the first layer insulating film 13 so as to reach the diffused layer 27 of the transistor 23. A stacked capacitor 41 is formed so as to be connected to the transistor 23 through the contact hole 14. The stacked capacitor 41 is formed by steps of forming a storage node 42, forming a dielectric film by, for example, a chemical vapor deposition process (CVD process), subjecting the dielectric film to photolithographic etching process to form a capacitor dielectric film 44, forming a conductive film, and subjecting the conductive film to a photolithographic etching process to form a plate electrode 43. Then, the surface of the semiconductor DRAM in process is covered with a second layer insulating film 15. A bit contact hole 25 is formed in the memory cell area 21 through the second layer insulating film 15 by a photolithographic etching process so as to reach the diffused layer 28 of the transistors 22 and 23, and then a contact hole 36 is formed in the peripheral circuit area 31 through the second layer insulating film 15 by a photolithographic etching process so as to reach the diffused layer 35 of the transistor 32. Then, insulating films 26 and 37 are formed respectively over the side surfaces of the bit contact hole 25 and the contact hole 36 by a known side surface coating process, plugs 16 are formed in the bit contact hole 25 and the contact hole 36 by a known wiring line forming process, and a bit line 18 is formed on the second layer insulating film 15 so as to be connected to the plugs 16 and 17.

When fabricating the semiconductor DRAM by the foregoing method, the bit contact hole 25 in the memory cell area 21, and the contact hole 36 in the peripheral circuit area 31 must be formed respectively, by different photolithographic etching processes because the plate electrode 43 is formed in the memory cell area 21. If the bit contact hole 25 and the contact hole 36 are preformed simultaneously in the memory cell area 21 and the peripheral circuit area 31 by a photolithographic etching process, only the second layer insulating film 15 is etched in the memory cell area 21 because the plate electrode 43 is formed in the memory cell area 21, while both the first layer insulating film 13 and the second layer insulating film 15 are etched in the peripheral circuit area 31. When etching the plate electrode 43 by the next photolithographic etching process, a portion of the semiconductor substrate 11 in the peripheral circuit area 31 is etched because the plate electrode 43 is not formed in the peripheral circuit area 31. Consequently, the contact hole 36 penetrates the diffused region 35 formed in the upper surface of the semiconductor substrate 11. Thus, the conventional method of fabricating a semiconductor DRAM needs two photolithographic etching processes to form the contact hole 36, which is one of the causes limiting the throughput of the semiconductor DRAM fabricating process.

SUMMARY OF THE INVENTION

Accordingly, it is an object of the present invention to provide a semiconductor DRAM having a layer structure that can be formed by a reduced number of processes.

Another object of the present invention is to provide a method of fabricating a semiconductor DRAM having a layer structure that can be fabricated by a reduced number of processes.

In one aspect of the present invention, each of memory cells of a semiconductor DRAM has a plate electrode forming film formed on a first layer insulating film formed in a bit contact forming portion of a memory cell area and a contact forming portion of a peripheral circuit forming area, a plate electrode forming film is formed over the entire surface of the semiconductor DRAM in process, a second layer insulating film is formed over the entire surface of a portion of the semiconductor DRAM in process on the side of the plate electrode, a bit contact hole is formed through the plate electrode forming film and the first layer insulating film in the bit contact forming portion, a contact hole is formed through the plate electrode forming film and the first layer insulating film in the contact forming portion of the second layer insulating film, insulating films are formed over the side surfaces of the bit contact hole and the contact hole, and a bit line is formed on the second layer insulating film.

A first method of fabricating each of the memory cells of the foregoing semiconductor DRAM of the present invention comprises: a first process comprising steps of forming transistors in the memory cell area, forming the transistor in a peripheral circuit area, forming the first layer insulating film, forming the storage node electrode of the memory cell, forming the capacitor dielectric film over the storage node, and forming the plate electrode forming film over the entire surface of the semiconductor DRAM in process; a second process of patterning the plate electrode forming film to form the plate electrode, leaving portions of the plate electrode forming film corresponding to the bit contact hole and the contact hole; a third process of forming the second layer insulating film over the entire surface of the semiconductor DRAM in process; a fourth process comprising steps of forming the bit contact hole and the contact hole through the plate electrode forming film and the first layer insulating film respectively at predetermined positions on the second layer insulating film, and forming the insulating films over the respective side surfaces of the bit contact hole and the contact hole; and a fifth process of forming the bit line connecting the bit contact hole and the contact hole to a specified element.

A second method of fabricating the foregoing semiconductor DRAM of the present invention comprises a first process comprising steps of forming the first layer insulating film so as to cover the transistors formed in the memory cell area and the element formed in the peripheral circuit forming area, forming the storage node electrode of the memory cell and the capacitor dielectric film, and forming the plate electrode over the entire surface of the semiconductor DRAM in process, and executing the third, fourth and fifth processes of the first method of fabricating the semiconductor DRAM.

Since the semiconductor DRAM of the present invention has the plate electrode forming film for forming the plate electrode of a stacked capacitor is formed on the first layer insulating film formed over the bit contact forming portion in the memory cell area and the contact forming portion of the peripheral circuit area, a layer structure in the bit contact forming portion of the memory cell area and that of the contact forming portion of the peripheral circuit area are the same.

Since the first method of fabricating the semiconductor DRAM leaves portions of the plate electrode forming film corresponding to the bit contact forming portion of the memory cell area and the contact forming portion of the peripheral circuit area when forming the plate electrode by patterning the plate electrode forming film, the bit contact hole of the memory cell area and the contact hole of the peripheral circuit area can be simultaneously formed, which enables the omission of one photolithographic process and one etching process among the processes of the conventional method of fabricating a semiconductor DRAM.

Since the second method of fabricating the semiconductor DRAM forms the plate electrode over the entire surface of the semiconductor DRAM in process of the semiconductor DRAM, and then forms the bit contact hole and the contact hole, the photolithographic process and the etching process of the first method for processing the plate electrode forming film to form the plate electrode can be omitted.

BRIEF DESCRIPTION OF THE DRAWINGS

The above and other objects, features and advantages of the present invention will become more apparent from the following description taken in connection with the accompanying drawings, in which:

FIG. 1 is a schematic sectional view of a semiconductor DRAM in a first embodiment according to the present invention;

DETAILED DESCRIPTION OF THE PREFERRED EMBODIMENTS

Figure 7:
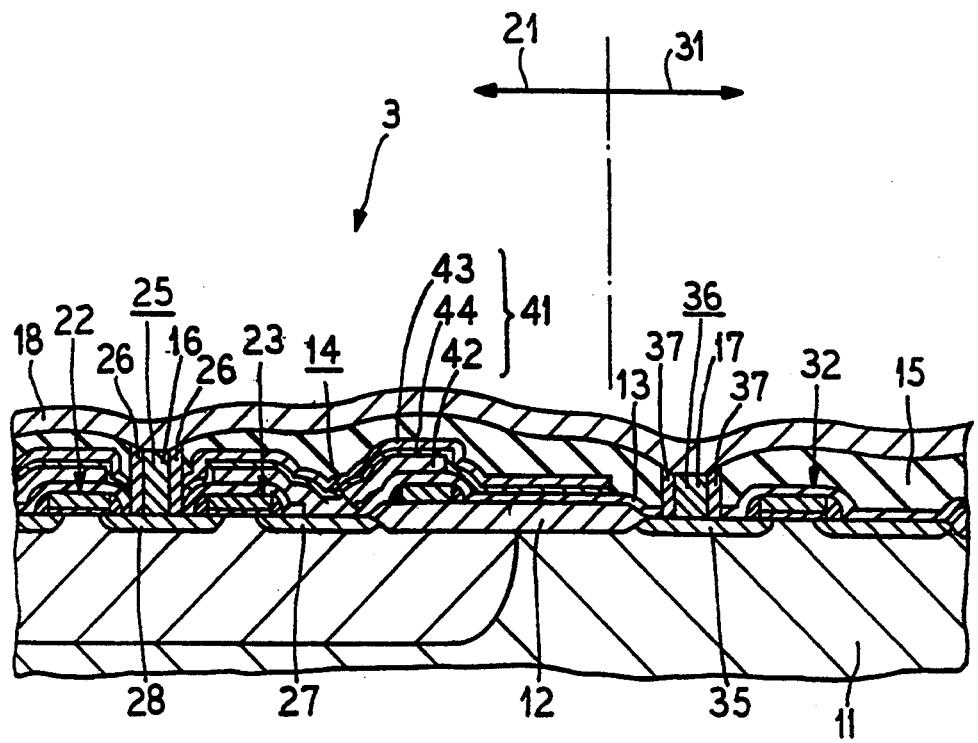
FIG. 7 is a schematic sectional view of a conventional semiconductor DRAM.

A semiconductor DRAM 1 in a first embodiment according to the present invention will be described hereinafter with reference to FIG. 1, in which parts like or corresponding to those previously described with reference to FIG. 7 are denoted by the same reference characters.

Referring to FIG. 1, each of the memory cells of the semiconductor DRAM 1 has transistors 22 and 23 formed in a memory cell area 21 of a semiconductor substrate 11, and a transistor 32 formed in a peripheral circuit area 31 of the semiconductor substrate 11. The memory cell forming area 21 and the peripheral circuit forming area 31 are separated by an isolating region 12. A first layer insulating film 13 is formed so as to cover the transistors 22, 23 and 32. A contact hole 14 reaching the diffused layer 27 of the transistor 23 is formed at a specified position through the first layer insulating film 13.

A stacked capacitor 41 is formed so as to be connected to the diffused layer 27 through the contact hole 14. The stacked capacitor 41 comprises a storage node electrode 42 connected to the diffused layer 27, a capacitor dielectric film 44 formed over the storage node electrode 42, and a plate electrode 43 formed over the capacitor dielectric film 44. The plate electrode 43 is extended over a bit contact forming portion 24 of a portion of the first layer insulating film 13 in the memory cell area 21. A portion of a plate electrode forming film 53 forming the plate electrode 43, corresponding to a contact forming portion 34 of a portion of the first layer insulating film 13 in the peripheral circuit area 31 is left when removing part of the plate electrode forming film 53 by a photolithographic process. A second layer insulating film 15 is formed so as to cover the plate electrode 43 and the remaining portion of the plate electrode forming film 53.

A bit contact hole 25 reaching a diffused layer 28 is formed in the bit contact forming portion 24 through the second layer insulating film 15, the plate electrode 43 and the first layer insulating film 13. A contact hole 36 reaching the diffused layer 35 is formed in the contact forming portion 34 through the second layer insulating film 15, the remaining portions of the plate electrode forming film 53 and the first layer insulating film 13. An insulating film 26 is formed over the side surface of the bit contact hole 25, and an insulating film 37 is formed over the side surface of the contact hole 36. Plugs 16 and 17 of, for example, blanket tungsten, are formed respectively in the bit contact hole 25 and the contact hole 26. A bit line 18 is formed on the second layer insulating film 15 so as to be connected to the plugs 16 and 17. If the material of the bit line 18 has a high covering ability, the plugs 16 and 17 need not necessarily be formed.

In the semiconductor DRAM 1 thus constructed, portions of the plate electrode forming film 53 corresponding to the bit contact forming portion 24 in the memory cell area 21 and the contact forming portion 34 of the peripheral circuit forming area 31 are left on the first layer insulating film 13. Accordingly, the layer structure in the portions of the memory cell area 21 in which the bit contact hole 25 is to be formed and the layer structure in the portion of the peripheral circuit area 31 in which the contact hole 36 is to be formed are identical.

A first method of fabricating each of the memory cells of the semiconductor DRAM 1 in the first embodiment will be described hereinafter with reference to FIGS. 2(1), 2(2), 2(3), 3(4) and 3(5).

Figure 2A:
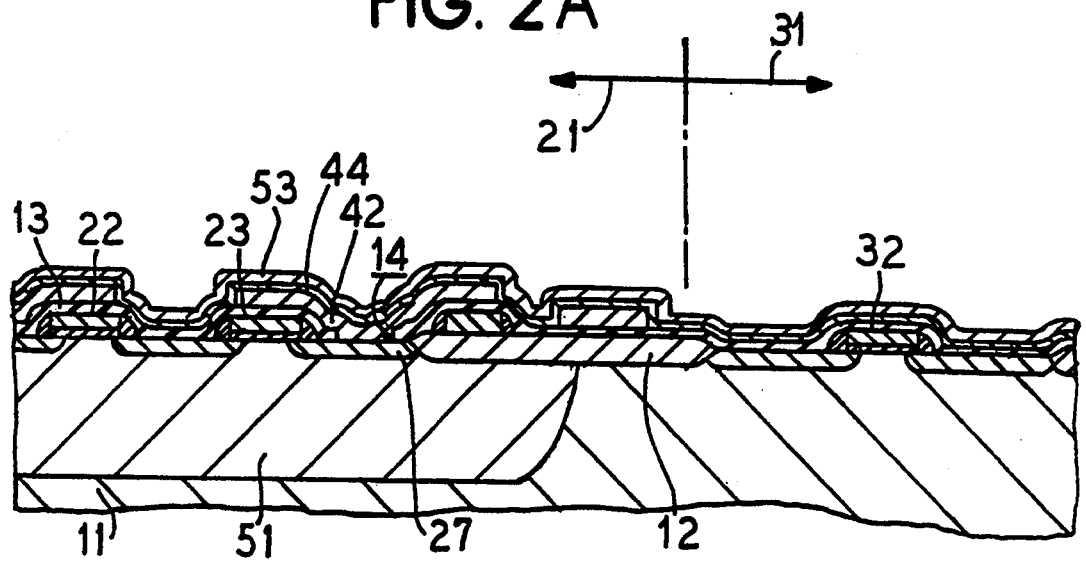
FIGS. 2(1), 2(2) and 2(3) are schematic sectional views of the semiconductor DRAM of FIG. 1 at different stages of a first semiconductor DRAM fabricating method.
Figure 2B:
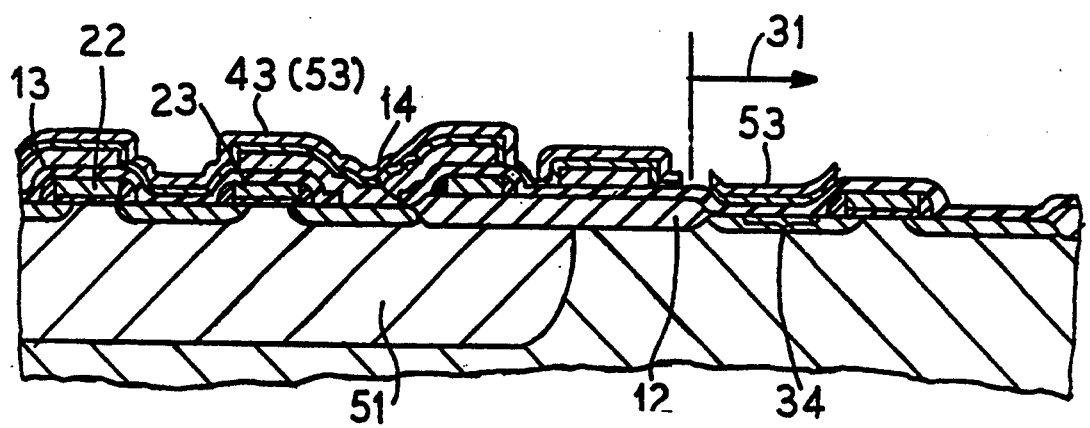
Figure 2C:
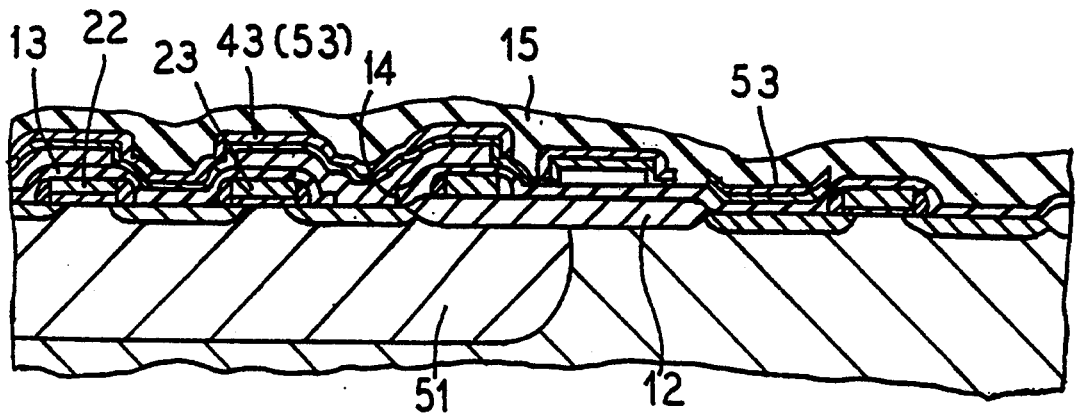

Referring to FIG. 2(2), in a first process, the isolating region 12 for electrically separating the memory cell area 21 and the peripheral circuit area 31 is formed in a specified area in the surface of the semiconductor substrate 11 by a known LOCOS process, and then a well region 51 is formed in the surface of the semiconductor substrate 11 by a known ion implantation process. Then, the transistors 22 and 23 are formed in the memory cell area 21 and the transistor 32 of a peripheral circuit is formed in the peripheral circuit area 31 by known processes.

The first layer insulating film 13, such as a silicon dioxide film, is formed so as to cover the transistors 22, 23 and 32 by a low-pressure CVD (chemical vapor deposition) process. Then, the contact hole 14 for the storage node electrode 42 reaching the diffused layer 27 of the transistor 23 is formed through the first layer insulating film 13 by a known photolithographic etching process. Then, a polycrystalline silicon film doped with a conductive impurity is formed by a CVD process. The storage node electrode 42 is formed by subjecting the polycrystalline silicon film to photolithographic etching. The capacitor dielectric film 44 is formed so as to cover the storage node electrode 42 by a CVD process. The capacitor dielectric film 44 is formed of silicon dioxide, silicon nitride or tantalum oxide. Then, the plate electrode forming film 53 is formed by forming a polycrystalline silicon film of a thickness in the range of several tens to several hundreds nanometers by a CVD process, and then introducing phosphorus into the polycrystalline silicon film by a predeposition method using, for example, phosphorus trichloride.

Referring to FIG. 2(2), in a second process, the plate electrode forming film 53 is patterned by a photolithographic etching process to form the plate electrode 43, in which a portion of the plate electrode forming film 53 corresponding to the contact forming portion 34 in the peripheral circuit area 31 is left.

Referring to FIG. 2(3), in a third process, the second layer insulating film 15 having a substantially flat surface is formed by forming a silicon dioxide film by a CVD process, forming a SOG (spin on glass) film over the silicon dioxide film by a known coating process, and partially removing the surface region of the SOG film by a known etchback process.

Figure 3A:
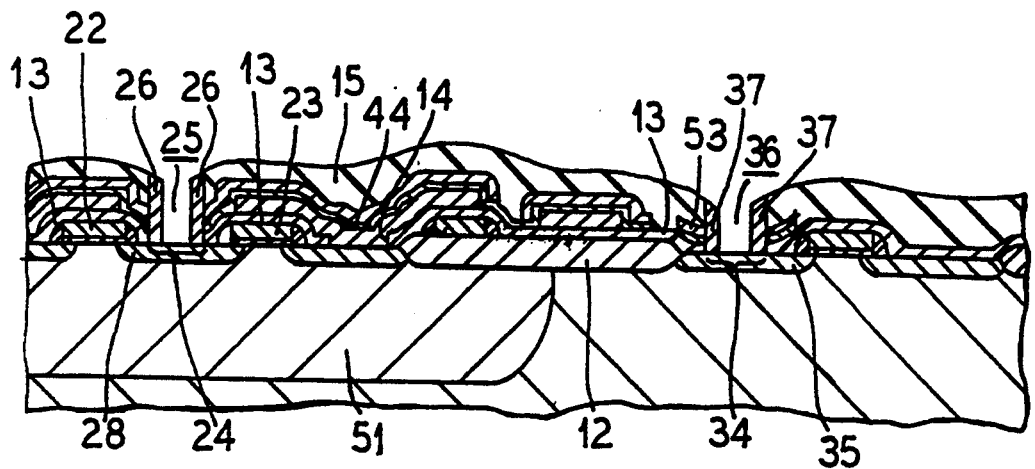
FIGS. 3(4) and 3(5) are schematic sectional views of the semiconductor DRAM of FIG. 1 at different stages of the first semiconductor DRAM fabricating method.
Figure 3B:
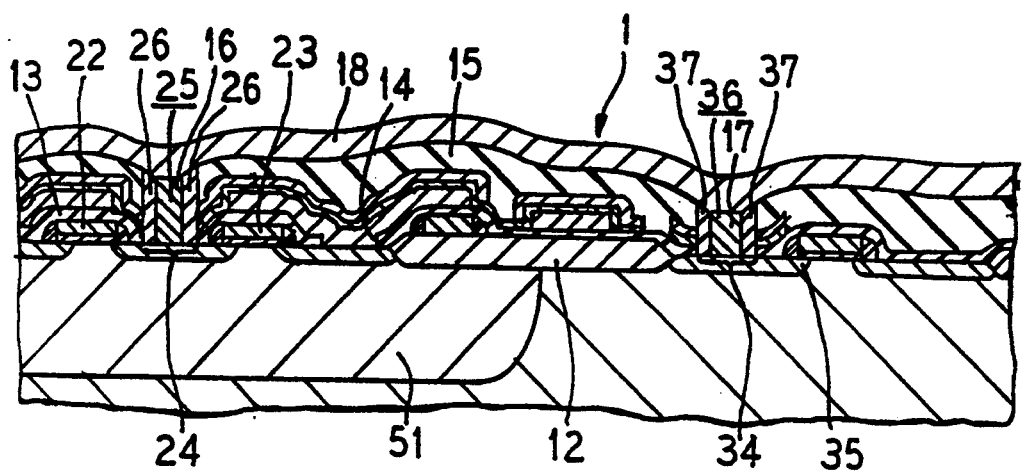

Referring to FIG. 3(4), in a fourth process, the bit contact hole 25 reaching the diffused layer 28 is formed in the bit contact forming portion 24 through the second layer insulating film 15, the plate electrode 43 and the first layer insulating film 13 by a photolithographic etching process and, at the same time, the contact hole 36 reaching the diffused layer 35 is formed in the contact forming portion 34 through the second layer insulating film 15, the remaining portions of the plate electrode forming film 53 and the first layer insulating film 13. Then, insulating films 26 and 37 are formed respectively over the side surfaces of the bit contact hole 25 and the contact hole 36.

Referring to FIG. 3(5), in a fifth process, the plugs 16 and 17 of blanket tungsten are formed respectively in the bit contact hole 25 and the contact hole 36 by a known process. Then, the bit line 18 is formed on the second layer insulating film 15 so as to be connected to the plugs 16 and 17 by a known wiring line forming process to complete the semiconductor DRAM 1.

When thus fabricating the semiconductor DRAM 1, the bit contact hole 25 in the memory cell area 21 and the contact hole 36 in the peripheral circuit area 31 can be formed simultaneously because a portion of the plate electrode forming film 53 are left in the contact forming portion 35 of the peripheral circuit area 31, so that one photolithographic etching process among the processes of forming a conventional semiconductor DRAM can be omitted.

A semiconductor DRAM 2 in a second embodiment according to the present invention will be described hereinafter with reference to FIG. 4, in which parts like or corresponding to those previously described with reference to FIG. 1 are denoted by the same reference characters and the description thereof will be omitted.

Figure 4:
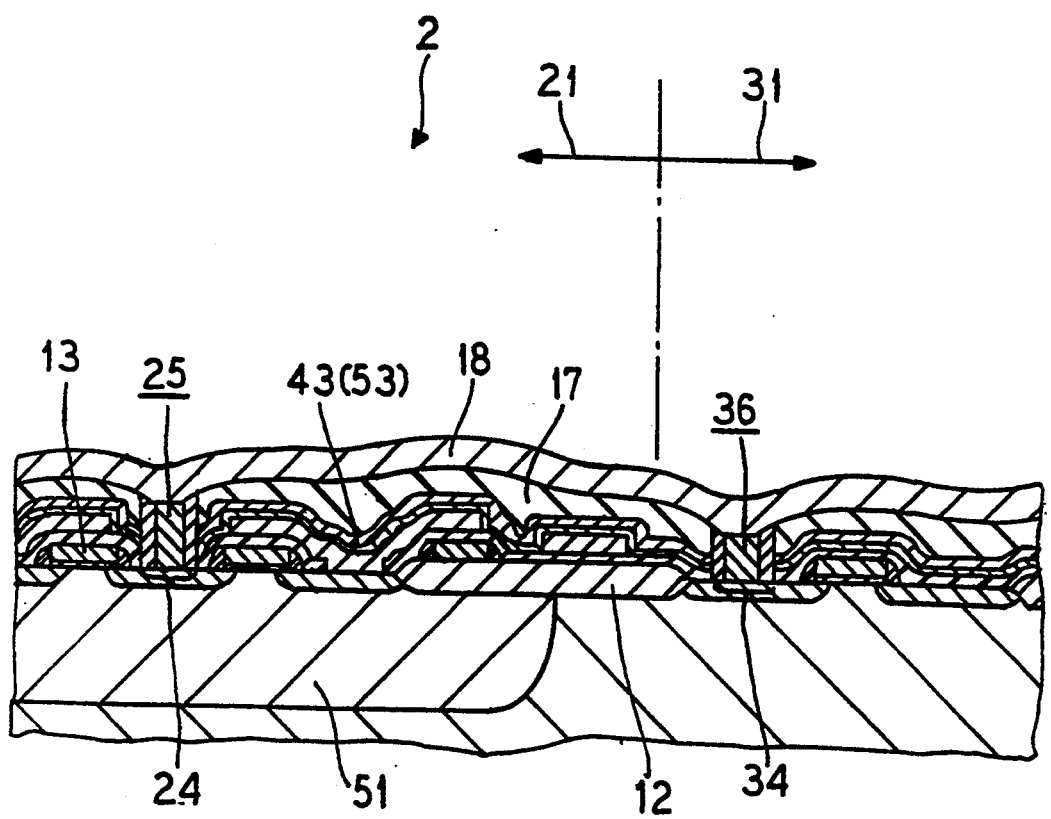
FIG. 4 is a schematic sectional view of a semiconductor DRAM in a second embodiment according to the present invention.

As shown in FIG. 4, the layer structure of the semiconductor DRAM 2 is similar to that of the semiconductor DRAM 1 shown in FIG. 1, except that a plate electrode 43 corresponding to the plate electrode of the semiconductor DRAM 1 is formed in both a memory cell area 21 and a peripheral circuit area 31, i.e., a plate electrode forming film 53 is formed over the entire surface of the semiconductor DRAM 2 in process.

Referring to FIG. 4, the plate electrode 43 is formed over a first layer insulating film 13 in both bit a contact forming portion 24 of the memory cell area 21 and a contact forming portion 34 of the peripheral circuit area 31. Therefore, a bit contact hole 25 and a contact hole 36 can be simultaneously formed respectively in the memory cell area 21 and the peripheral circuit area 31.

A second method of fabricating each of the memory cells of the semiconductor DRAM 2 shown in FIG. 4 will be described hereinafter. The second method omits the second process of forming the plate electrode 43 by patterning the plate electrode forming film 53 previously described with reference to FIG. 2(2) and carries out the third, fourth and fifth processes after the first process previously described with reference to FIG. 2(1).

Figure 5A:
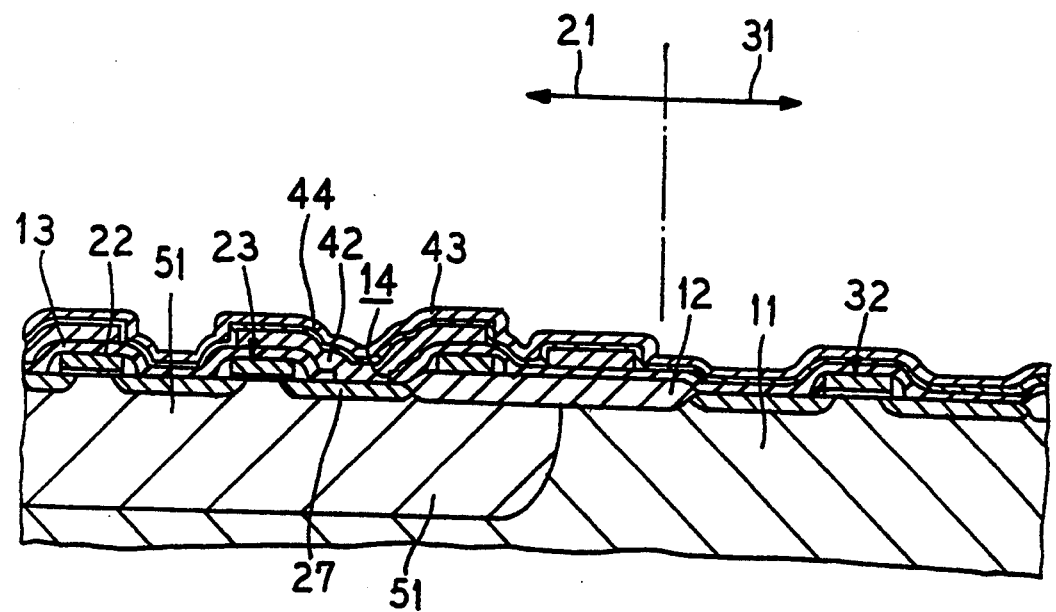
FIGS. 5(1) and 5(2) are schematic sectional views of the semiconductor DRAM of FIG. 4 at different stages of a second semiconductor DRAM fabricating method.
Figure 5B:
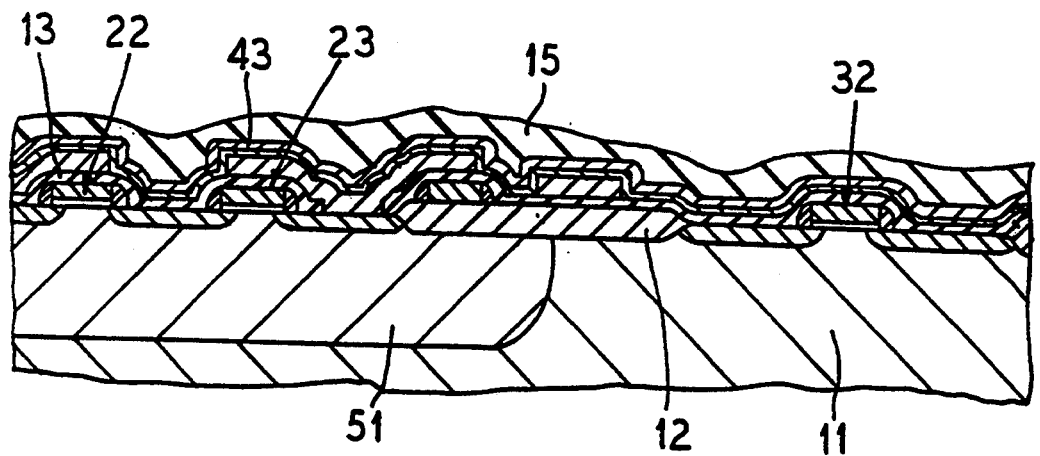

Referring to FIG. 5(1), in a first process, the isolating region 12 for electrically separating the memory cell area 21 and the peripheral area 31 is formed in the surface of the semiconductor substrate 11 by the same processes as those employed in the first process previously described with reference to FIG. 2(1). Then, a well region 51 is formed in the surface of the semiconductor substrate 11 in the memory cell area 21. Then, the transistors 22 and 23 are formed in the memory cell area and the transistor 32 is formed in the peripheral circuit area 31 by known processes. Then, the first layer insulating film 13 is formed so as to cover the transistors 22, 23 and 32 by a known process, and the contact hole 14 for the storage node electrode 42 reaching the diffused layer 27 of the transistor 23 through the first layer insulating film 13 by a photolithographic etching process. Then, the storage node electrode 42 connected to the diffused layer 27 is formed in the contact hole 14 by a CVD process. Then, the capacitor dielectric film 44 is formed so as to cover the storage node electrode 42. Then, a polycrystalline silicon film of a thickness in the range of several tens to several hundreds nanometers is formed over the entire surface of the capacitor dielectric film 44, and then phosphorus trichloride is introduced into the polycrystalline silicon film by a predeposition process.

Referring to FIG. 5(2), in a second process, the second layer insulating film 15 is formed over the entire surface of the plate electrode 43 by the same processes as those of the third process carried out in the stage shown in FIG. 2(3) of fabricating the semiconductor DRAM in the first embodiment.

Figure 6A:
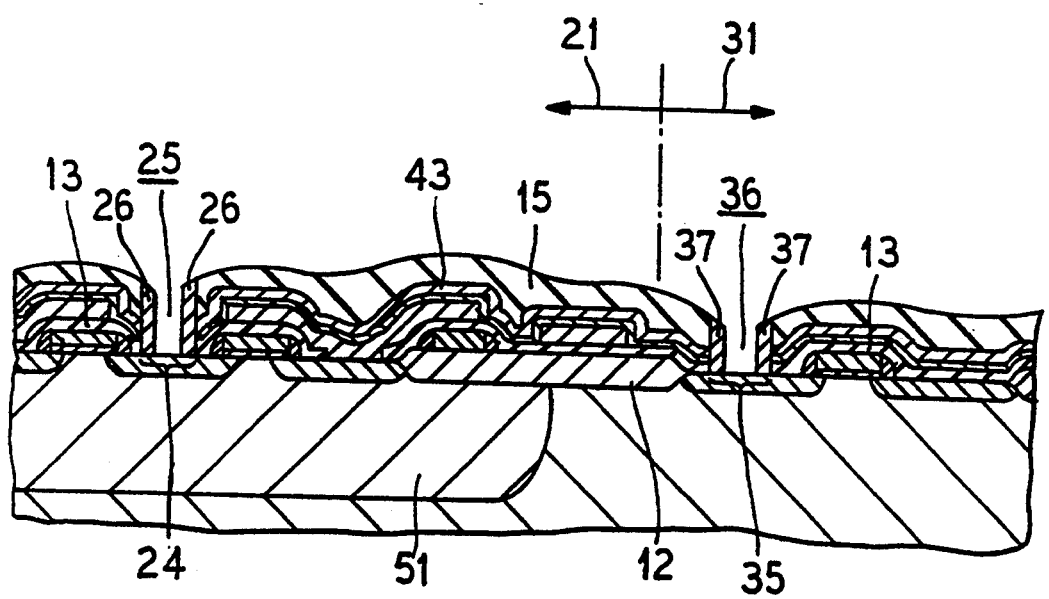
FIGS. 6(3) and 6(4) are schematic sectional views of the semiconductor DRAM of FIG. 4 at different stages of the second semiconductor DRAM fabricating method.
Figure 6B:
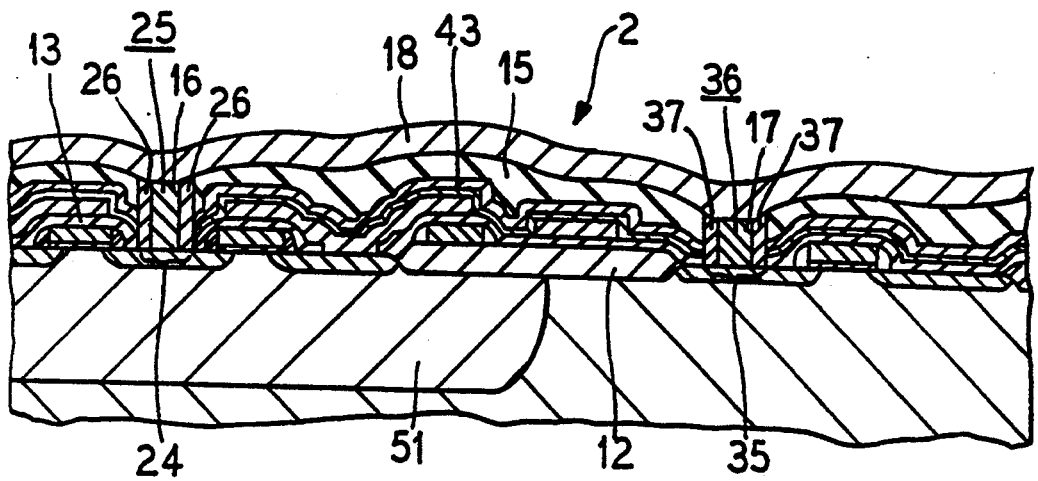

Referring to FIG. 6(3) in a third process, the same photolithographic etching process as that of the fourth process carried out in the stage shown in FIG. 3(4) of fabricating the semiconductor DRAM 1 in the first embodiment is carried out to form the bit contact hole 25 in the bit contact forming portion 24 in the memory cell area 21 and the contact hole 36 in the contact forming portion in the peripheral circuit forming area 31 through the second layer insulating film 15, the plate electrode 43 and the first layer insulating film 13, and then insulating films 26 and 37 are formed respectively over the side surfaces of the bit contact hole 25 and the contact hole 36.

Referring to FIG. 6(4), in a fourth process, the same processes as those of the fifth process carried out in the state shown in FIG. 3(5) of fabricating the semiconductor DRAM 1 in the first embodiment are carried out to form the plugs 16 and 17 by depositing blanket tungsten in the bit contact hole 25 and the contact hole 36, and then the bit line 18 is formed on the second layer insulating film 15 so as to be connected to the plugs 16 and 17 by a known wiring line forming process to complete the semiconductor DRAM 2.

The second method omits one photolithographic process and one etching process among those of the first method because the second method forms the plate electrode 43 over the entire surface of the semiconductor DRAM 2.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A method of making a semiconductor DRAM on a substrate comprising a memory cell area having a capacitor and a pair of transistors and a peripheral circuit area having a third transistor, said method comprising the steps of:

forming said pair of transistors of said memory cell area in said substrate;

forming a third transistor in said peripheral circuit area of said substrate;

forming a storage node electrode for said capacitor in said memory cell area of said substrate;

forming an insulating layer on said storage node electrode;

forming a plate electrode over said memory cell area and said peripheral circuit area;

simultaneously forming a pair of openings in said plate electrode and said insulating layer with one opening extending to said pair of transistors and the other opening extending to said third transistor;

forming first and second electrodes in said one and said other openings, and selectively removing said plate electrode except over said storage node electrode and contact regions of said pair of transistors and said third transistor before forming said pair of openings in said plate electrode.

2. A method of making a semiconductor DRAM on a substrate comprising a memory cell area having a storage capacitor and a pair of transistors which are of the metal-insulator-semiconductor field effect type, and a peripheral circuit area including a third transistor, said method comprising steps of:

forming source regions, drain regions and gate electrodes of said pair: of field effect transistors in said memory cell area of said substrate;

forming said third transistor in said peripheral area of said substrate;

forming a storage node electrode which constitutes one electrode of said storage capacitor and said storage node electrode electrically connected to at least one of said source regions;

forming an insulating layer on said storage node electrode;

forming a plate electrode over said memory cell and said peripheral circuit area;

simultaneously forming a pair of openings with one opening extending through said plate electrode and said insulating layer to one of said drain regions of one of said field effect transistors and the other opening extending to a contact region of said third transistor;

forming an insulating material on the sidewalls of both of said openings;

forming electrodes in said pair of openings;

selectively removing said plate electrode except over said storage node electrode, said drain regions and said third transistor, before forming openings in said plate electrode;

wherein said storage node electrode extends over at least one of said gate electrodes: and wherein said plate electrode extends beyond said storage node electrode over said one of said source regions.

* * * * *